United States Patent
Imai et al.

(10) Patent No.: US 9,302,447 B2
(45) Date of Patent: Apr. 5, 2016

(54) ANTISTATIC LAMINATE AND LAMINATE MATERIAL INCLUDING THE SAME

(75) Inventors: Kazuko Imai, Brussels (BE); Yumiko Oomori, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 828 days.

(21) Appl. No.: 13/635,180

(22) PCT Filed: Mar. 3, 2011

(86) PCT No.: PCT/JP2011/054990
§ 371 (c)(1),
(2), (4) Date: Sep. 14, 2012

(87) PCT Pub. No.: WO2011/118361
PCT Pub. Date: Sep. 29, 2011

(65) Prior Publication Data
US 2013/0011663 A1 Jan. 10, 2013

(30) Foreign Application Priority Data

Mar. 24, 2010 (JP) .................. 2010-068751
Jul. 12, 2010 (JP) .................. 2010-157573

(51) Int. Cl.
*B32B 7/02* (2006.01)
*B32B 27/12* (2006.01)
*B32B 23/08* (2006.01)
*B32B 23/06* (2006.01)

(52) U.S. Cl.
CPC . *B32B 7/02* (2013.01); *B32B 23/06* (2013.01); *B32B 23/08* (2013.01); *B32B 27/12* (2013.01); *B32B 2262/04* (2013.01); *B32B 2307/21* (2013.01); *Y10T 428/26* (2015.01)

(58) Field of Classification Search
None
See application file for complete search history.

(56) References Cited

U.S. PATENT DOCUMENTS

| 4,909,901 A * | 3/1990 | McAllister et al. ........... 162/125 |
| 2012/0175073 A1* | 7/2012 | Nonni et al. ..................... 162/67 |

FOREIGN PATENT DOCUMENTS

| EP | 2505604 A1 | 10/2012 |
| EP | 2546297 A1 | 1/2013 |
| JP | 9-309514 | 2/1997 |
| JP | 2002-201367 | 7/2002 |
| JP | 2003-507583 | 2/2003 |
| JP | 2006-106427 | 4/2006 |
| JP | 2006-161022 | 6/2006 |
| JP | 2008-143033 | 6/2008 |
| JP | 2008-308802 | 12/2008 |
| JP | 2009-57552 | 3/2009 |
| JP | 2009-293167 | 12/2009 |
| JP | 2010-179579 | 8/2010 |
| JP | 2010-179580 | 8/2010 |
| JP | 2010-215779 | 9/2010 |
| JP | 2011-57749 | 3/2011 |
| JP | 2011-57912 | 3/2011 |
| WO | WO 2009/069641 A1 | 6/2009 |
| WO | WO 2010/074340 A1 | 7/2010 |
| WO | WO 2010/074341 A1 | 7/2010 |
| WO | WO 2010/138941 A2 * | 12/2010 |

OTHER PUBLICATIONS

European Search Report issued Aug. 5, 2013 in corresponding European Application No. 11759169.3.
International Search Report of Corresponding PCT Application PCT/JP2011/054990 mailed May 17, 2011.

* cited by examiner

*Primary Examiner* — Sheeba Ahmed (57) ABSTRACT

An antistatic laminate and a laminate material equipped with the laminate are provided, wherein the laminate includes a base material and an antistatic layer which comprises a cellulose fiber having a carboxyl group, and the laminate can prevent deterioration of antistatic properties under a low humidity environment, while high transparency is maintained due to use of a material wherein natural resources are effectively used.

22 Claims, 4 Drawing Sheets

ANTISTATIC LAMINATE AND LAMINATE MATERIAL INCLUDING THE SAME

The present invention relates to a laminate in which plural layers are laminated, and in particular, relates to an antistatic laminate including an antistatic layer including cellulose, which is natural resource, and a laminating material including the same.

BACKGROUND ART

In general, an electrical charge is generated by contact or friction in the inside of the surface of a material. In particular, in a case where the material is an electrical insulator such as chemical fibers or plastics, an electrical charge which is generated at the surface of the material accumulates without leakage from the surface of the material. The electrical charge accumulated at the surface thereof causes various problems in manufacturing processes or use of the material, since the electrical charge causes phenomena such as adhesion of dust, sticking of dust, repulsion, electric shock, discharge or the like. Accordingly, up to now, in order to leak smoothly an electrical charge which is generated at the surface of a material without accumulation, many methods for providing antistatic properties to a material have been proposed.

For example, an anti-reflection film is provided at the surface of a display or window for the purpose of preventing reflection of light, and adhesion of dust to the surface of the anti-reflection film is regarded as a problem. Accordingly, for example, in techniques which are described in Patent Documents 1 and 2, a method is proposed wherein antistatic properties are provided volumetrically by adding metal oxide particles having conductivity such as tin oxide, indium oxide, aluminium oxide, zinc oxide or the like in a hard coat layer of a film wherein plural layers are laminated.

Furthermore, for example, with respect to a packaging material used for food, when contents such as a fine powder or thin material (for example, shavings of dried bonito, flour, curry powder, a mixture of red pepper and other spices, furikake, tororo konbu, powder medicine or the like) is filled in a packaging material, the fine powder or thin material adheres to a sealing part due to static electricity, and causes insufficient sealing. Furthermore, when unsealing is performed to take out the contents, problems are caused wherein the contents adhere to a packaging material and it is difficult to take out the contents. Furthermore, adhesion of dust to an exterior package causes poor appearance. Accordingly, for example, a technique described in Patent Document 3 proposes a method wherein a layer including a surface-active agent such as a quaternary ammonium salt or the like is introduced in a packaging material which is a laminate, so that antistatic properties are provided to the laminate by adsorbing atmospheric moisture due to the layer.

Furthermore, for example, with respect to a packaging material for industrial materials, when electronic equipment or the like is packed, breakage of the contents caused by electrostatic charge or discharge is problematic. Therefore, for example, in a technique described in Patent Document 4, a metal thin film such as an Al-metallized film, an Al foil-laminated film or the like, which is excellent in conductivity, is used.

PRIOR ART DOCUMENTS

Patent Documents

Patent Document 1: Japanese Unexamined Patent Application, First Publication No. 2006-161022

Patent Document 2: Japanese Unexamined Patent Application, First Publication No. 2006-106427

Patent Document 3: Japanese Unexamined Patent Application, First Publication No. 2008-143033

Patent Document 4: Japanese Unexamined Patent Application, First Publication No. Hei 9-309514

Patent document 5: Japanese Unexamined Patent Application, First Publication No. 2008-308802

DISCLOSURE OF INVENTION

Problem to be Solved by the Invention

The methods wherein conductive particles are added to a polymer material to achieve conductivity based on the volumetric point can achieve high conductivity, such as techniques as described in Patent Documents 1 and 2. However, if the conductive particles do not adhere to each other, such expected effects cannot be obtained. Accordingly, the amount of conductive particles tends to increase, and as a result, problems such as aggregation and precipitation of the particles, coloring, deterioration of transparency or the like are caused.

Furthermore, as described in a technique of Patent Document 3, in a case where a surface-active agent which adsorbs atmospheric moisture to achieve electro conductivity is used, problems are caused wherein the ability of antistatic properties deteriorates under a dry atmosphere, expected effects are lost after cleaning since a surface-active agent is generally water-soluble, or the like.

Furthermore, antistatic effects of a surface-active agent are highly susceptible by atmospheric humidity, and therefore problems are caused such that antistatic effects of a surface-active agent are not expected when packing is performed under an atmosphere wherein humidity is extremely low.

Furthermore, a surface-active agent gradually diffuses toward the surface of a packaging material. Therefore, problems are caused wherein the appearance becomes poor due to whitening caused at the surface of the packing material, blocking is caused at the time of manufacture or preservation of a packing material, and furthermore a surface-active agent is eliminated due to water washing or friction.

Furthermore, a packing material in which a metal film is provided is opaque as described in a technique of Patent Document 4. Therefore, there are problems in that the content included therein cannot be confirmed, a metal detector cannot be used when inspection is performed for the content, and the packing material must be disposed as a noncombustible material.

Accordingly, there are still many demands for new antistatic techniques wherein the aforementioned problems are overcome.

On the other hand, in recent years, environmental problems such as an environmental load to the earth, an exhaustion of fossil resources, waste disposal or the like have become serious. Therefore, development of a material which effectively uses natural resources instead of fossil resources is requested. Among them, a cellulose-based material has gained attention as a biomass material which is the most generated material on the earth and as a material which is biodegradable in natural environments. In particular, a nano-fiber cellulose, which has high transparency as well as cellulose characteristics such as high strength, high elastic modulus, high crystallinity and a low thermal linear expansion coefficient is expected as a new cellulose material and to be used as a high performance material. (For example, refer to Patent Document 5.)

Here, in order to solve the aforementioned problems of the conventional antistatic technology, the purpose of the present invention is to provide an antistatic laminate including an antistatic layer, which can prevent deterioration of antistatic properties under a low humidity environment while high transparency is maintained due to use of a material wherein natural resources are effectively used; and to provide a laminate material including the laminate such as a packaging material and an anti-reflection film.

Means for Solving the Problem

That is, as means to solve the aforementioned problems, an invention described in Claim 1 provides an antistatic laminate which includes laminated plural layers and is used to prevent charging, wherein the laminate has a base material and an antistatic layer which is laminated on at least one surface side of the base material, and the antistatic layer includes a cellulose fiber having a carboxyl group.

Furthermore, an invention described in Claim 2 is the antistatic laminate disclosed in Claim 1, characterized in that the cellulose fiber is a cellulose fiber to which a carboxyl group is introduced by an acid reaction, and the content of the carboxyl group per 1 g of the cellulose fiber is in a range of 0.1 mmol or more and 5 mmol or less.

Furthermore, an invention described in Claim 3 is the antistatic laminate described in Claim 2, characterized in that at least a part of the carboxyl group is a carboxyl acid salt.

Furthermore, an invention described in Claim 4 is the antistatic laminate described in Claim 3, characterized in that a fiber width of the cellulose fiber is 2 nm or more and 50 nm or less, and a length of the cellulose fiber is 1 μm or more.

Furthermore, an invention described in Claim 5 is the antistatic laminate described in Claim 4, characterized in that the cellulose fiber is a crystalline cellulose, and has a crystalline structure of cellulose type-I.

Furthermore, an invention described in Claim 6 is the antistatic laminate described in Claim 5, characterized in that the antistatic layer further includes a water absorbent.

Furthermore, an invention described in Claim 7 is the antistatic laminate described in Claim 6, characterized in that a weight ratio of the cellulose fiber and the water absorbent (cellulose fiber/water absorbent) is in a range of (5/95) or more and (95/5) or less.

Furthermore, an invention described in Claim 8 is the antistatic laminate described in Claim 7, characterized in that the water absorbent is an inorganic lamellar compound.

Furthermore, an invention described in Claim 9 is the antistatic laminate described in Claim 8, characterized in that a weight ratio of the cellulose fiber and the inorganic lamellar compound (cellulose fiber/inorganic lamellar compound) which are included in the antistatic layer is in a range of (20/80) or more and (70/30) or less.

Furthermore, an invention described in Claim 10 is the antistatic laminate described in Claim 9, characterized in that the thickness of the antistatic layer is 100 nm or more.

Furthermore, an invention described in Claim 11 is the antistatic laminate described in Claim 9, characterized in that electrical resistance at the surface of the antistatic laminate is $1.0 \times 10^{12} \Omega/\square$ or less under an environment of 25° C. and 20% RH.

Furthermore, an invention described in Claim 12 is the antistatic laminate described in Claim 9, characterized in that a half-life of surface charge at the surface of the antistatic laminate is 10 seconds or less under an environment of 25° C. and 20% RH.

Furthermore, an invention described in Claim 13 is the antistatic laminate described in Claim 9, characterized in that the base material is made from plastic, and haze of the antistatic laminate is in a range of 0.1% or more and 10% or less.

Furthermore, an invention described in Claim 14 is the antistatic laminate described in Claim 9, characterized in that the base material is made from paper.

Furthermore, an invention described in Claim 15 is a laminate material which includes the antistatic laminate described in Claim 9.

Effects of the Invention

An antistatic laminate and a laminate material including the antistatic laminate according to the present invention can achieve high transparency and effectively use natural resources, since a cellulose-based material is used as a material which forms an antistatic layer.

Furthermore, the antistatic layer is a layer which includes cellulose having a carboxyl group, and therefore it is possible to prevent deterioration of antistatic properties under a low humidity atmosphere. Furthermore, when the antistatic layer is a layer which includes a cellulose fiber and a water absorbent which has excellent moisture control ability, it is further possible to prevent the decrease of antistatic properties under a low humidity environment.

BEST MODE FOR CARRYING OUT THE INVENTION

Hereinafter, an antistatic laminate of the present invention and a laminate material including the laminate are explained in detail according to embodiments.

Figure 1:
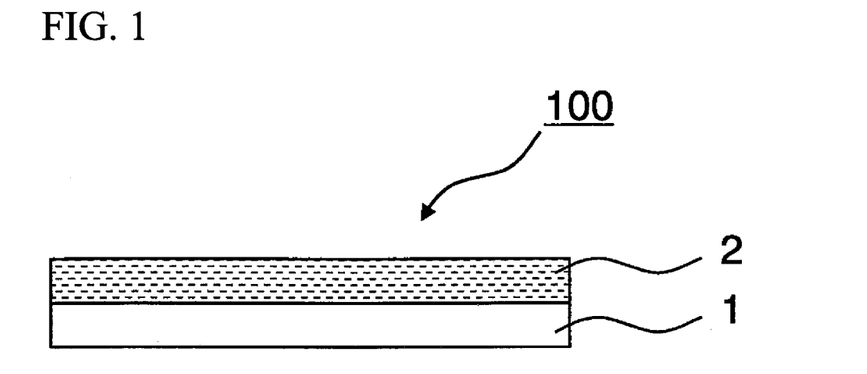
FIG. 1 is a cross-sectional view of the first embodiment of an antistatic laminate according to the present invention.

As shown in FIG. 1, an antistatic laminate 100 according to the first embodiment of the present invention is equipped with a base material 1 and an antistatic later 2 which is provided to at least one surface of the substrate 1. Here, the antistatic layer 2 is a layer which includes a cellulose fiber having a carboxyl group.

Concretely, as the base material 1, a plastic material which may have various polymer compositions can be used. For example, a base material made of polyolefins (polyethylene, polypropylene and the like), polyesters (polyethylene terephthalate, polyethylene naphthalate or the like), celluloses (triacetyl cellulose, diacetyl cellulose, cellophane or the like), polyamides (nylon-6, nylon-66 or the like), acrylics (polymethyl methacrylate or the like), polystyrene, polyvinyl chloride, polyimide, polyvinyl alcohol, polycarbonate, ethylene vinyl alcohol or the like can be used. Furthermore, organic polymer materials which include, as a component or a copolymer component, one or more kinds selected from the aforementioned plastic materials, or organic polymer materials which include modified compounds of the aforementioned plastic materials as a component, can be used.

Furthermore, in order to increase adhesiveness between the base material 1 and another layer which is provided on the surface of the base material, modification such as corona treatment, plasma treatment, frame processing, ozonization, anchor coat treatment or the like may be performed on the surface of the base material 1 in advance.

Furthermore, in recent years, it has been considered effective to use materials which can decrease environmental load even if the decreased load is small. That is, for example, a base material which includes a bioplastic which is chemically synthesized from plants, such as a polylactic acid and biopolyolefin, or includes plastic which is generated by microbes, such as hydroxy alkanoate, can be used as the base material 1 of the present embodiment. Furthermore, it is possible to use paper which is generated from natural fibers such as wood and plants via steps such as pulping and paper-machining, and nonwoven fabric formed with natural fibers. Furthermore, cellophane, acetylated cellulose and cellulose derivatives, which include a cellulose-based material, and a base material including nano-fiber like cellulose, which is used in an antistatic layer 2 described below, or the like can also be used.

Furthermore, the structure of the base material is not limited in particular. For example, various formed bodies such as film-like, sheet-like, bottle-like, column-like or the like can be used appropriately in accordance with use. However, when excellent transparency and flexibility of nano-fiber like cellulose included in the antistatic layer 2 described below is taken in to account, a film-like base material is preferable as the base material 1, and a transparent plastic film or paper is preferably used.

Furthermore, when a film-like plastic film is used as the base material 1, either a stretched film or an unstretched film can be used. Furthermore, a material having mechanical strength and size stability is preferable. For example, a polyethylene terephthalate film and a polyamide film, which are biaxially oriented optionally, are preferably used.

Furthermore, as the base material 1, a material can also be used to which functions are added using various conventionally known additives and stabilizers such as a plasticizer, a lubricant, an antioxidant and an ultraviolet ray inhibitor.

Furthermore, the base material 1 can be selected appropriately in accordance with use thereof. For example, when an antistatic laminate 100 (hereinafter, it is noted that 200, 300, 400, 500, 600, 700 and 800 of another embodiment described below are also applied) is used as a packaging material which is a laminate material, a polyolefin-based film, a polyester-based film and a polyamide-based film are preferably used from the viewpoints of cost, moisture resistance, filling properties, texture and disposal properties.

On the other hand, when the antistatic laminate 100 is used optically, for example, as an antireflection film or the like for a display which is a laminate material, polyethylene terephthalate, triacetyl cellulose, polycarbonate and polymethyl methacrylate are desirable from the viewpoints of transparency, refractivity of light, impact resistance, heat resistance and durability. Among them, triacetyl cellulose is preferably used for a liquid crystal display, due to small birefringence and excellent transparency thereof.

When plastic is used as the base material 1, it is preferable that haze (turbidity) of the antistatic laminate be in a range of 1% or more and 10% or less. When haze of an antistatic laminate is in a range of 1% or more and 10% or less, the laminate obtained has excellent transparency, and therefore, when such a laminate is used as a packaging material, the content therein can be confirmed easily. Furthermore, it can be expected that such a laminate is applied to a packaging material having superior design.

Haze of an antistatic laminate can be measured by, for example, a Haze meter NDH-2000 (manufactured by Nippon Denshoku Industries Co., Ltd.) according to JIS-K 7105.

Next, the aforementioned antistatic layer 2 is explained in detail.

The antistatic layer 2 includes a cellulose fiber having a carboxyl group. Accordingly, the antistatic layer 2 can maintain high transparency with a material wherein natural resources are effectively used. Furthermore, sufficient ability is not achieved at a low humidity environment, when a general ionic conduction type antistatic agent is used. However, since the antistatic laminate 100 uses a cellulose fiber, deterioration of antistatic properties under a low humidity environment can be prevented due to excellent water-holding capacity of the cellulose.

Furthermore, the cellulose fiber is a cellulose fiber to which a carboxyl group is introduced by an acid reaction. The content of a carboxyl group per 1 g of the cellulose fiber is in a range of 0.1 mmol or more and 5.0 mmol or less, preferably in a range of 0.5 mmol or more and 3.0 mmol or less, and still more preferably in a range of 1.0 mmol or more and 2.0 mmol or less. When a cellulose fiber has a carboxyl group which is introduced by an acid reaction and the amount of the carboxyl group is in the range described above, fiberization of the cellulose fiber can be performed, while crystallinity can be maintained.

Furthermore, a carboxyl group included in the cellulose fiber is characterized in that at least one part of carboxyl groups of the cellulose is a carboxyl acid salt. A cellulose fiber wherein such a salt is formed can show high antistatic properties by the similar principle to a surface-active agent. That is, it is possible to show high antistatic properties since it absorbs moisture at the surface of an antistatic layer.

For example, as a cation which is used as a counter ion of a carboxyl group, an alkali metal ion (lithium, sodium, potassium and the like), an alkaline earth metal ion (calcium), an ammonium ion, an alkyl ammonium ion (tetraethylammonium, tetrabutylammonium, benzyltrimethylammonium and the like) can be cited. Salt may be formed by mixing two or more kinds thereof.

Here, it is considered that a cellulose fiber in which salt is formed shows antistatic properties by the similar principle to a surface-active agent, that is, by water adsorption at the surface of the antistatic layer 2. Generally, there are, as an antistatic agent, an ionic conduction type antistatic agent such as antimony pentoxide and an electronic conduction type antistatic agent such as polyacetylene, polyparaphenylene, polypyrrole, polythiophene and polyaniline. A cellulose fiber used in the antistatic layer 2 corresponds to an ionic conduction type antistatic agent.

In the case of a general ionic conductive type antistatic agent, sufficient ability cannot be achieved under a low humidity atmosphere. On the other hand, in the case where the aforementioned cellulose fiber is used, deterioration of antistatic properties under a low humidity atmosphere can be prevented due to excellent water retention characteristics of cellulose. In particular, with a cellulose fiber wherein salt is formed, antistatic properties can be sufficiently achieved.

In the antistatic layer 2, when the cellulose fiber has a salt formed therein, the degree of antistatic properties can be appropriately controlled according to the kind of salt and the amount of a carboxyl group in the cellulose fiber. As the kind of salt, a carboxyl group to which the aforementioned cation is used as a counter ion can be cited. Particularly, a salt wherein an alkali metal ion or an alkaline earth metal ion is used as a cation is preferably used.

Furthermore, a cellulose fiber included in the antistatic layer 2 is characterized in that a fiber width of the cellulose fiber is 2 nm or more and 50 nm or less, and a length of the cellulose fiber is 1 μm or more. It is not preferable that a fiber width of the cellulose fiber exceed 50 nm since transparency of the film deteriorates. It is also not preferable that a length of a fiber be less than 2 μm (particularly, less than 1 μm) since such a length of a fiber may cause deterioration of the film strength. Furthermore, when a size of a cellulose fiber is 2 nm or more and 50 nm or less and a length of the cellulose fiber is in a range of 1 μm or more, it is possible to form a film which is excellent in transparency and strength even if a binder is not used, since a dense and entangled structure is formed by the cellulose fiber. Furthermore, since a dense and entangled structure is formed between fibers, the effect is not lost by cleaning, and a film which is excellent in durability and water resistance can be obtained.

On the other hand, as described above, a cellulose fiber is excellent in moisture retention, and therefore a decrease of properties of the fiber in a low humidity environment is not large as compared with a general ionic conductive type antistatic agent. Furthermore, for example, it is possible to prevent problems regarding deterioration of properties, wherein the deterioration is caused by surface whitening and elimination of a surface-active agent when a surface-active agent such as quaternary ammonium salt or the like is used. However, there is scope for further improvement.

Accordingly, the antistatic laminate layer 2 of the present invention includes a water absorbent as well as a cellulose fiber. By adding a water absorbent, it is possible to add a moisture control function to the antistatic layer, and prevent deterioration of antistatic properties in a low humidity environment.

As a water absorbent, a cage material such as synthetic zeolite, an inorganic laminar compound and activated carbon and a so-called moisture absorbent such as polyacrylate, magnesium sulfate, calcium oxide and aluminium oxide can be cited, and they are selected and used appropriately. Particularly, the inorganic laminar compound is preferable since it is excellent in transparency, moisture retention rate, safety and the like. The inorganic laminar compound maintains moisture between layers thereof, and therefore can maintain antistatic properties of a cellulose fiber in a low humidity environment. Above all, a compound having swelling property is particularly preferable. The inorganic laminar compound is in general classified into a type which has a two-layer structure wherein an octahedral layer in which aluminium, magnesium or the like exist as central metal is provided above a tetragonal layer of silica; and a type having a three-layer structure wherein an octahedral layer in which aluminium, magnesium or the like exist as central metal is sandwiched by tetragonal layers of silica from both sides. The former includes a kaolinite group, an antigorite group and the like, and the latter includes a smectite group, a vermiculite group, a mica group and the like according to the number of cation between layers thereof. Concrete examples include kaolinite, dickite, nacrite, halloysite, antigorite, chrysotile, pyrophyllite, montmorillonite, hectorite, tetrasilicic mica, sodium teniolite, white mica, margarite, talc, vermiculite, brown mica, xanthophyllite and chlorite.

Furthermore, when a moisture absorbent is included in the antistatic layer 2, it is characterized in that a weight ratio of the cellulose fiber and the moisture absorbent (cellulose fiber/moisture absorbent) is in a range of (5/95) or more and (95/5) or less. When the ratio of the moisture absorbent is less than the (95/5), moisture controlling properties of the moisture absorbent are insufficiently exhibited, and antistatic properties in a low humidity environment decrease. Furthermore, when the ratio of cellulose fiber is less than (5/95), the content of the cellulose fiber is extremely small, and therefore, sufficient antistatic properties cannot be obtained and transparency deteriorates. It is particular preferable that a weight ratio of the cellulose fiber and the moisture absorbent (cellulose fiber/moisture absorbent) be (20/80) or more and (80/20) or less.

Furthermore, when an inorganic lamellar compound which has high water retention properties is used as a moisture absorbent, it is characterized in that a weight ratio of the cellulose fiber and the inorganic lamellar compound (cellulose fiber/inorganic lamellar compound), which are included in the antistatic layer 2, is in a range of (20/80) or more and (70/30) or less. It is particularly preferable that a weight ratio of the cellulose fiber and the inorganic lamellar compound (cellulose fiber/inorganic lamellar compound) be in a range of (30/70) or more and (60/40) or less.

Furthermore, in the antistatic later 2, as well as a cellulose fiber and an aqueous absorbent, additional materials may be mixed. Although the additional materials other than the cellulose fiber and the moisture absorbent are not limited, for example, a water-soluble polymer (polyvinyl alcohol, ethylene vinyl, an alcohol copolymer, polymethacrylic acid, polyacrylic acid, polyamine, polyurethane and derivatives thereof), water-soluble polysaccharides (starch, carboxymethyl starch, cationized starch, curdlan, chitin, chitosan, carboxymethyl cellulose, hydroxymethyl cellulose, alginic acid, pectin, guar gum, carrageenan and the like), an isocyanate compound, an epoxy compound, a carbodiimide compound, a silanol compound, an oxazoline compound, an amine compound, metal alkoxide (tetraethoxy silane, aluminium triisopropoxide) and hydrolyzates thereof, polyvalent cation, a polyfunctional (meth)acrylate compound, a polyfunctional urethane (meth)acrylate compound, and a resin having an acrylate-based functional group (a polyether resin, a polyester resin, an epoxy resin, an alkyd resin, a spiroacetal resin, a polybutadiene resin and a polythiol polyene resin) or the like can be used. Furthermore, among them, two or more kinds can be used in combination.

In particular, water-soluble polysaccharides have a chemical structure which is similar to a cellulose fiber, adhere easily to a cellulose fiber, and show high adhesiveness to the surface of a cellulose fiber. Accordingly, functionalization of a film such as addition of physical strength to the film can be designed. Furthermore, it can be obtained from natural biomass resources, and it is preferable as a material which has a small environmental burden. Furthermore, in the antistatic layer 2, additives can be added in order to provide functions. For example, a silane-coupling agent, a leveling agent, an antifoaming agent, an inorganic particle, an organic particle, lubricant, an UV absorber, dye, a coloring agent and a stabilizer can be used. They can be added in so far as they do not deteriorate antistatic properties, and can improve characteristics of a laminate according to the use thereof.

Furthermore, the antistatic layer 2 is characterized in that the thickness thereof is 100 nm or more. When the thickness of the antistatic layer 2 is less than 100 nm, it is difficult to achieve stable antistatic properties since surface unevenness or the like of the base material 1 occurs. Furthermore, when the thickness of the antistatic layer 2 is 100 nm or more, sufficient antistatic properties can be achieved even when the antistatic laminate 100 is used for any purpose.

Here, an antistatic layer according to the present invention is not limited to the aforementioned embodiments, and various changes are possible in so far as the object of the present invention is not affected. That is, an antistatic laminate according to the present invention has an antistatic layer which includes a cellulose fiber having a carboxyl group on at least one surface of a base material. For example, another layer may be provided between the aforementioned base material 1 and the antistatic layer 2, may be provided on the antistatic layer 2, or on another surface of the base material 1 on which the antistatic layer 2 is not provided.

Concretely, other embodiments of an antistatic laminate according to the present invention (the second to the eighth embodiments) are shown in FIGS. 2 to 8. However, an antistatic laminate of the present invention is not limited thereto.

Figure 2:
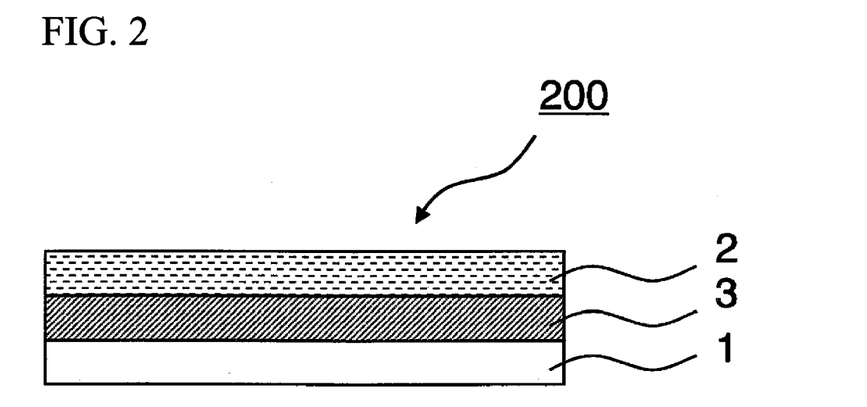
FIG. 2 is a cross-sectional view of the second embodiment of an antistatic laminate according to the present invention.

For example, the aforementioned first embodiment is an example which is merely consisting of the base material 1 and the antistatic layer 2, but an antistatic laminate 200 of the second embodiment shown in FIG. 2 is an example wherein an anchor coat layer 3 is provided between the base material 1 and antistatic layer 2 thereof. Furthermore, an antistatic laminate 300 of the third embodiment shows an example wherein a deposition layer 4 is provide between the base material 1 and the antistatic layer 2 thereof. Furthermore, an antistatic laminate 400 of the fourth embodiment shows an example wherein the anchor coat layer 3 and the deposition layer 4 are provided between the base material 1 and the antistatic layer 2 thereof.

Figure 3:
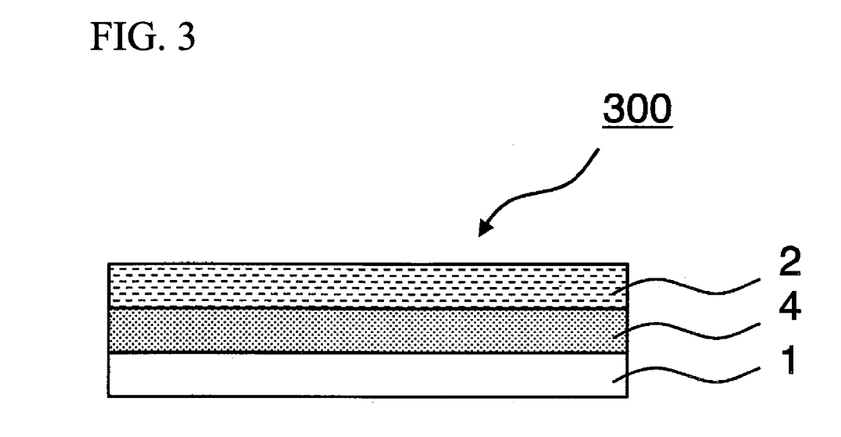
FIG. 3 is a cross-sectional view of the third embodiment of an antistatic laminate according to the present invention.
Figure 4:
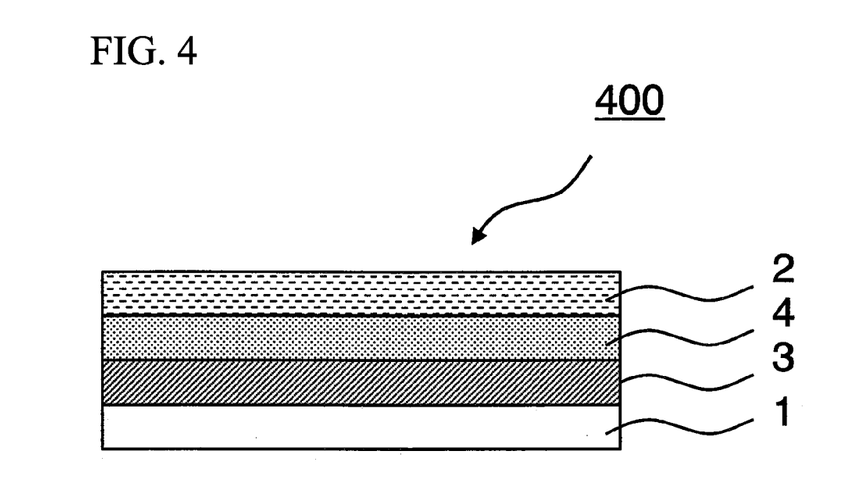
FIG. 4 is a cross-sectional view of the fourth embodiment of an antistatic laminate according to the present invention.

As shown in these examples, an antistatic laminate according to the present invention can include another layer which is different from the antistatic layer 2 having carboxyl group, such that: the anchor coat layer 3 or deposition layer 4 is laminated appropriately between the base material 1 an antistatic layer 2; a layer described below is a laminate such as an intermediate film layer 7, a gas barrier layer 8, a hard coat layer 10 or the like; and a printing layer, an undercoat layer, a filling layer, an optical adjustment layer or the like is laminated.

Figure 5:
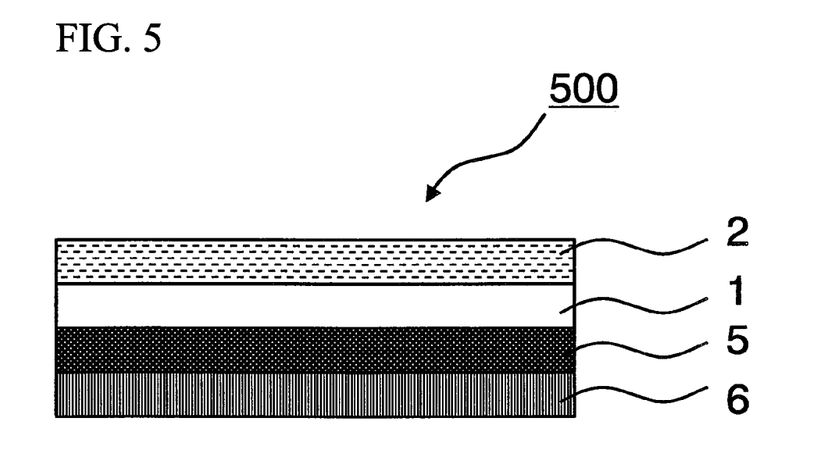
FIG. 5 is a cross-sectional view of the fifth embodiment of an antistatic laminate according to the present invention.

Furthermore, for example, as an antistatic laminate 500 of the fifth embodiment according to the present invention as shown in FIG. 5, an adhesive layer 5 and a heat seal layer 6 used for lamination are further laminated on any one surface of the base material 1 and antistatic layer 2 of the aforementioned antistatic laminate (for example, as the first to fourth embodiments (the aforementioned figure represents the first embodiment)). In this way, various layers can be formed on another surface of the base material 1 where the antistatic layer 2 is not provided or on the surface of the antistatic layer 2, and examples of the various layers include a printing layer, a surface protective layer, an anti-glare layer, a top coat layer, layers described below such as a low refraction index layer 9 and a hard coat layer 10, as well as the adhesive layer 5 for lamination and the heat seal layer 6.

Figure 6:
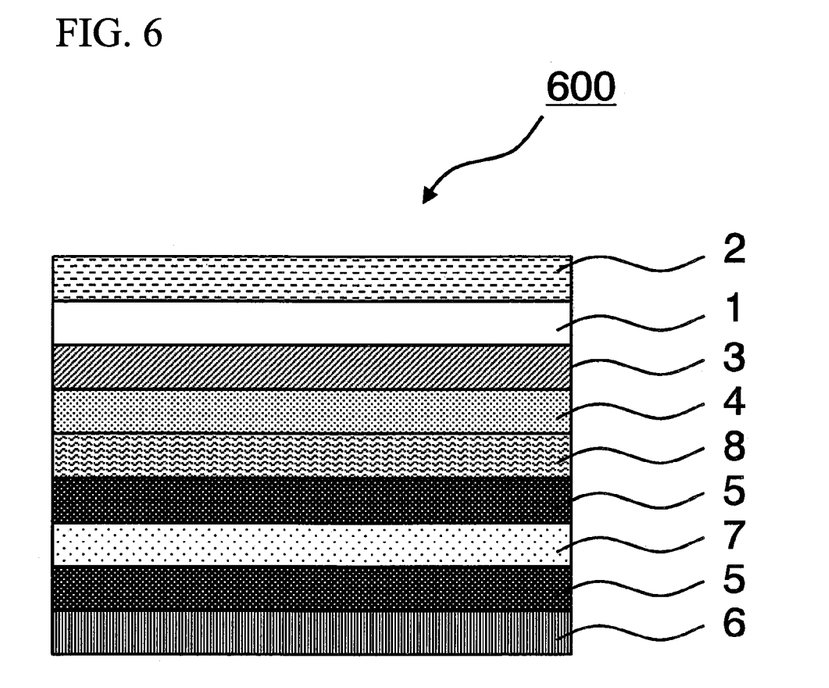
FIG. 6 is a cross-sectional view of the sixth embodiment of an antistatic laminate according to the present invention.

Furthermore, when another layer is laminated by a dry lamination method, a wet lamination method or the like, for example, as shown in an antistatic laminate 600 of the sixth embodiment of FIG. 6, the intermediate film layer 7, adhesive layer 5, gas barrier layer 8, deposition layer 4 and anchor coat layer 3 may be furthermore laminated in this order between layers (1, 2) and layers formed by the heat seal layer 6 and adhesive layer 5 for a laminate of an antistatic laminate (the first to fourth embodiments, (the figure shows an structural example of the first embodiment)), as shown in the figure. In this way, an antistatic laminate of the present invention can include; the adhesive layer 5 for a laminate which is used for laminating another layer; the anchor coat layer 3 or a primer layer which is used when the aforementioned heat seal layer 6 is laminated by a melt extrusion method; and other layers such as an undercoat agent layer and a surface treatment layer which is formed by surface treatment.

Figure 7:
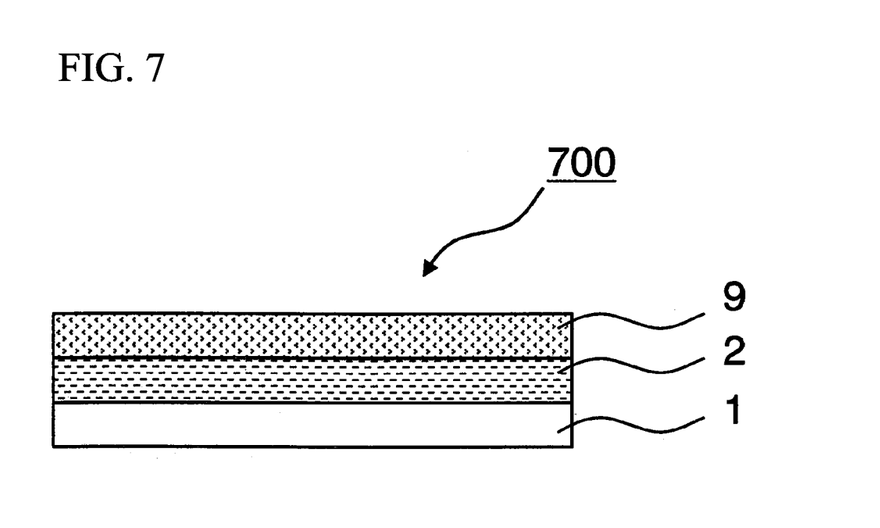
FIG. 7 is a cross-sectional view of the seventh embodiment of an antistatic laminate according to the present invention.

Furthermore, an antistatic laminate according to the present invention may have, for example, as provided in an antistatic laminate 700 of the seventh embodiment shown in FIG. 7, a low refraction index layer 9 laminated on the surface of an antistatic laminate (of the first to fourth embodiments (said figure shows a structural example of the first embodiment)). Furthermore, as provided in an antistatic laminate 800 of the eight embodiment shown in FIG. 8, the hard coat layer 10 and low refraction index layer 9 may be laminated on the surface of an antistatic laminate (of the first to fourth embodiments (said figure shows a structural example of the first embodiment)).

In the antistatic laminate according to the present invention, for example, structures shown in the fifth and sixth embodiments can be used appropriately for use as a wrapping material which is a laminate material. Furthermore, for example, structures shown in the seventh and eighth embodiments can be appropriately used for use of an antireflection film which is a laminate material.

Here, the antistatic laminates 100, 200, 300, 400, 500, 600, 700 and 800, which have each of the laminate structures of the aforementioned embodiments, are characterized in that electric resistivity (surface resistivity) of the laminates at the surface thereof is $1.0 \times 10^{12} \Omega/\square$ or less under an environment of 25° C. and 20% RH. When the electric resistivity at the surface of the laminate exceeds $1.0 \times 10^{12} \Omega/\square$, problems such as adhesion of dust, discharge or the like are caused, and therefore sufficient antistatic properties cannot be obtained.

As a measurement method of electric resistivity which is an index of antistatic property, for example, a method which is performed according to JIS 6911 and using a high resistivity measurement meter Hiresta UP (manufactured by DIA Instruments Co., Ltd.) can be used. When humidity dependability of electric resistivity is evaluated at the surface of a laminate, measurement is performed under an environment of 25° C. and from 20 to 80% RH.

Furthermore, the antistatic laminates 100, 200, 300, 400, 500, 600, 700 and 800 are characterized in that the half-life of surface resistivity is 10 seconds or less at the surface of the laminates under an environment of 25° C. and from 20% RH. When the half-life of surface charge exceeds 10 seconds, electrical charge generated cannot leak immediately. The longer the half-life is, the higher the risk becomes wherein problems are caused such as adhesion of dust and electric discharge. It is still more preferable that the half-life of surface charge at the surface of the laminate be 5 seconds or less.

As the measurement of the half-life, for example, measurement can be performed by the method according to JIS 1094 with Static Honestmeter H-0110 (manufactured by Shishido Electrostatic, Ltd.). Similar to electric resistivity, when humidity dependability is evaluated, measurement is performed under an environment of 25° C. and from 20 to 80% RH.

Here, with respect to the antistatic laminates 100, 200, 300, 400, 500, 600, 700 and 800, the half-life of electric resistivity and electric charge at the surface thereof can be controlled appropriately, according to use of these antistatic laminates.

As a method of controlling the half-life of electric resistivity and half-life of electric charge of the surface of the antistatic laminate, a method wherein the content of a carboxyl group introduced in a cellulose fiber is varied to control the half-life, and a method wherein control is performed due to the blending amount of a moisture absorbent can be cited. When the former method is used, it is possible to control the half-life of electric resistivity and half-life of electric charge of the surface of the antistatic laminate accurately by a method wherein an oxidizing agent is used to oxidize a cellulose material under the presence of an N-oxyl compound (oxoammonium salt), and the content of a carboxyl group introduced to cellulose is changed in the aforementioned range, that is, in the range of 0.1 mmol or more and 5.0 mmol or less, per 1 g of a cellulose fiber to which an oxidation reaction is performed. Furthermore, under a low humidity environment, control which is performed based on the mixing amount of a moisture absorbent is effective.

Next, an example of a manufacturing method of a cellulose fiber having a carboxyl group, which is used in the antistatic laminate (100, 200, 300, 400, 500, 600, 700 and 800), is explained below.

As a method of introducing a carboxyl group in a cellulose molecule, some methods have been reported up to now. However, in order to obtain a cellulose fiber which is excellent in transparency, flexibility, strength and heat resistance and has a fibrous structure having a width of nano size, as provided by the present invention, it is preferable to use a method wherein a carboxyl group is introduced while a crystalline structure is maintained as much as possible. Accordingly, it is preferable that a cellulose fiber be a crystalline cellulose, and have a crystalline structure of cellulose type-I.

In general, cellulose is structured such that crystalline microfibrils, which are the minimum unit of a fiber, are gathered while orientating in various directions. Accordingly, in order to obtain a nanosized fiber from cellulose, it is necessary to unbind and disentangle microfibrils in pieces.

However, between microfibrils, innumerable hydrogen bonds combine the microfibrils strongly. Therefore, when physical dispersion (fiberization) treatment such as pulverization or the like is merely used, it is very difficult to unbind and disentangle microfibrils in pieces as described above. Accordingly, it is regarded as effective that a chemical treatment is performed in advance to introduce a carboxyl group to the surface of microfibrils, before physical dispersion (fiberization) treatment. When the method is used, an electrostatic repulsion of the introduced carboxyl group suppresses bonding strength which exists between microfibrils.

Concretely, a method is used wherein oxidation of a cellulose raw material is performed with an oxidaizing agent under the presence of an N-oxyl compound (oxoammonium salt). When the method is used, merely a primary hydroxyl group of cellulose, which exists at the surface of microfibrils, can be selectively oxidized due to steric hindrance of the N-oxyl compound, and therefore, a carboxyl group can be introduced efficiently while crystallinity hardly deteriorates.

Hereinafter, the aforementioned oxidation method is concretely explained.

As cellulose raw materials used in the oxidation method of the present invention, for example, various wood pulps which are obtained from a conifer, broad-leaved tree or the like, non-wood pulps which are obtained from a kenaf, bagasse, straw, bamboo, cotton, seaweed or the like, cellulose obtained from sea squirt, cellulose generated from a microbe or the like can be used. Commercial cellulose powder, fine crystal powdered cellulose, paper, regenerated paper and the like also can be used. Furthermore, as the N-oxyl compound, 2,2,6,6-tetramethyl-piperidine-N-oxy radical and derivatives thereof can be used. Furthermore, the oxidation reaction is advantageous when the reaction is performed under the coexistence with a bromide or iodide and the aforementioned N-oxyl compound. As the bromide or iodide, a compound which can form an ion by dissociation in water, such as alkali metal bromide or alkali metal iodide, can be used. As an oxidation agent, any oxidation agent such as halogen, a hypohalogenous acid, a halogenous acid, a perhalogenic acid, salts thereof, a halogen oxide, a nitrogen oxide, a peroxide and the like can be used in so far as it can accelerate an oxidation reaction.

Furthermore, although the conditions of the oxidation reaction should be optimized according to properties of cellulose and equipment used, it is preferable that temperature conditions at the time of oxidation be set to 50° C. or less, and more preferably in a range of 5° C. or more and 20° C. or less. When a temperature at the time of reaction exceeds 50° C., the introduced amount of a carboxyl group increases, but, on the other hand, decrease of molecular weight and oxidation and side reaction within microfibrils are caused, which have an influence on strength of a film.

The content of a carboxyl group introduced by the aforementioned method is preferably in a range of 0.1 mmol or more and 5.0 mmol or less per 1 g of cellulose to which an oxidation reaction has been performed. When the amount thereof is 0.1 mmol or more, 0.1 mmol or more, electrostatic repulsive force is generated and performs a function of assisting fiberization of a cellulose fiber. However, when the amount thereof exceeds 5.0 mmol, crystallinity of a cellulose fiber is lost, and therefore it is not preferable from the viewpoint of strength and the like.

Measurement method of a carboxyl group introduced is performed, for example, according to the following operations.

A cellulose fiber, to which a carboxyl group was introduced, is chemically treated, 0.2 g of the fiber is provided as converted dry weight in beaker, and 80 ml of deionized water is added to the beaker. To the beaker, 5 ml of an aqueous solution of 0.01 M of sodium chloride is added, and total pH is adjusted to pH 2.8 by adding 0.1 M of hydrochloric acid while stirring. A 0.1 M aqueous solution of sodium hydroxide is provided thereto at a rate of 0.05 ml/30 seconds by an automatic titrator (AUT-701, manufactured by DKK-TOA Corporation), and electric conductivity and pH value are measured every 30 seconds until a pH of 11 is reached. A titrated amount of sodium hydroxide is determined from an electric conductivity curve obtained, and the content of a carboxyl group is calculated. Here, a cellulose fiber having a carboxyl group used in the present invention is a fiber, wherein a carboxyl group is introduced to a cellulose raw material by the aforementioned method and then a dispersing treatment is performed in water to form a nano-fiber.

Hereinafter, formation of a nano-fiber from a cellulose fiber is explained.

A cellulose fiber to which a carboxyl group was introduced by the aforementioned oxidation method is further treated by a fiberization (dispersion) treatment to form a nano-fiber. As the method of fiberization, a treatment method using collision or shearing force, which is generated by a mixer, a high-speed rotary mixer, a share mixer, a blender, an ultrasonic homogenizer, a high pressure homogenizer, a ball mill or the like, can be used. Due to the method, fiberization of a cellulose fiber is performed to obtain a fiber of nano-order. When treatment is performed under optimum conditions, nano-fiber like cellulose which has a width of about 3 to 4 nm and a length of about several μm is generated.

Furthermore, as a dispersion medium (or solvent) used for the fiberization treatment of a cellulose fiber, for example, alcohols such as methanol, ethanol, n-propanol, iso-propanol, n-butanol and tert-butanol, glycols such as ethylene glycol, diethylene glycol, poryethylen glycol, propylene glycol, dipropylene glycol, tripropylene glycol, polypropylene glycol, 1,4-butanediol, 1,5-pentanediol, ethylene glycol monomethyl ether, ethylene glycol monoethyl ether, ethylene glycol monobutyl ether, diethylene glycol monomethyl ether, diethylene glycol monoethyl ether and tripropylene glycol monomethyl ether, ketones such as acetone, methyl ethyl ketone and methyl isobutyl ketone, ethers such as dioxane, tetrahydrofuran and ethyl ether, esters such as ethyl acetate, butyl acetate and isobutyl acetate or water can be used. These dispersion media (or solvents) may be used alone or in combination of two or more kinds, and water or a water/alcohol dispersion medium (solvent) is preferable to obtain a uniform dispersion of a cellulose fiber.

Next, a manufacturing method of the antistatic layer 2 of the aforementioned antistatic laminate is explained.

The antistatic layer 2 can be obtained such that a composition including a cellulose fiber for forming an antistatic layer is coated on the base material 1, and dried. As the method for forming the antistatic layer 2, conventional methods can be used. For example, a roll coater, a reverse roll coater, a gravure coater, a micro gravure coater, a knife coater, a bar coater, a wire bar coater, a die coater, a dip coater and the like can be used. Using the aforementioned coating method, at least one surface of the base material is coated.

As a drying method, natural drying, blowing drying, hot-air drying, UV drying, heat roller drying, infrared radiation drying and the like can be used.

Furthermore, in order to improve strength of a film and adhesiveness, it is also possible to perform UV irradiation or EB irradiation after the antistatic layer 2 is formed.

Furthermore, other layer can be laminated on the antistatic layer 2. For example, when a packaging material is prepared using the layer, a printing layer, a heat seal layer and the like may be laminated. A printing layer is provided when a packaging material or the like is formed to be used practically, and such a layer can be formed by a well-known printing method such as offset printing method, gravure printing method, silk screen printing method or the like, or by a well-known coating method such as roll coating, gravure coating or the like. The thickness of the layer is appropriately selected in a range of 0.01 μm or more and 2.0 μm or less.

Furthermore, another layer, which is other than the antistatic layer 2 and is provided on the base material 1, can be formed by a coating method using a roll coater, a reverse roll coater, a gravure coater, micro gravure coater, a knife coater, a bar coater, a wire bar coater, a die coater, a dip coater or the like, or by a film formation method such as a vacuum deposition method, a sputtering method, a plasma vapor deposition method or the like.

Furthermore, for example, a layer such as the aforementioned deposition layer 4 and the gas bather layer 8 can be formed by the aforementioned film forming method wherein aluminum oxide, magnesium oxide, tin oxide, silicon oxide or the like is used as a target.

Figure 8:
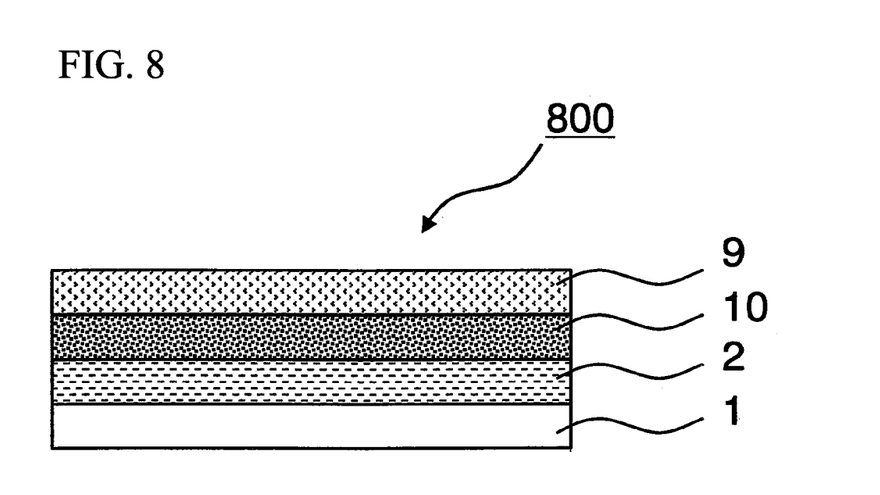
FIG. 8 is a cross-sectional view of the eighth embodiment of an antistatic laminate according to the present invention.

Furthermore, for example, a layer such as the anchor coat layer 3, adhesive layer 5 for laminate and hard coat layer 10 can be formed by the aforementioned coating method. Furthermore, when an adhesive for a laminate is used, it is possible to laminate a laminate, which includes the antistatic layer 2, and another laminate via the adhesive layer 5 for laminate.

Next, a laminate material comprising the aforementioned antistatic laminate is explained.

A laminate material comprising the aforementioned antistatic laminate is not limited in so far as the laminate material is a material having an antistatic function and includes a layer which includes a cellulose fiber having a carboxyl group. Concretely, a packaging material, to which contents such as a fine powder or thin material are filled, a packaging material which is used to wrap an industry material, electronic equipment or the like, an anti-reflection film for displays which is optically used, or the like can be cited. The laminate material comprising the aforementioned antistatic laminate can achieve effects and action according to the antistatic laminate.

EXAMPLES

Hereinafter, the present invention is explained concretely by examples, but the present invention is not limited thereto.

Here, among the examples described below, properties of an antistatic film (antistatic laminate) are evaluated according to the following methods.

Surface resistance: Measurement was performed by the method according to JIS 6911 with a high resistivity measurement meter Hiresta UP (manufactured by DIA Instruments Co., Ltd.).

Half-life: Measurement was performed by the method according to JIS 1094 with Static Honestmeter H-0110 (manufactured by Shishido Electrostatic, Ltd.).

Manufacturing Example 1

(Materials)

Cellulose: bleached kraft pulp (Machenzie j, manufactured by Fletcher Challenge Canada Ltd)

TENPO: a commercial product (manufactured by Tokyo Chemical Industry co., Ltd.)

Sodium hypochlorite: a commercial product (Wako Pure Chemical Industries, Ltd.)

Sodium bromide: a commercial product (Wako Pure Chemical Industries, Ltd.)

(Oxidation of TEMPO)

10 g of bleached kraft pulp (converted dried weight) was left to stand in 500 ml of water for one night to swell the pulp. The water was controlled to have a temperature of each condition shown in Table 1, and 0.1 g of TEMPO and 1 g of sodium bromide were added thereto to form a pulp suspension. Furthermore, 10 mmol/g of sodium hypochlorite per cellulose weight was added while stirring. At this time, a reaction thereof was performed at a temperature of 20° C. for 120 minutes while pH of the pulp suspension was maintained at about 10.5 by adding an about 1N aqueous solution of sodium hydroxide. Subsequently, neutralization was performed with 2N hydrochloric acid, and furthermore washing was performed with water to obtain oxidized cellulose (oxidization type).

(Measurement of the Carboxyl Group Content)

The content of a carboxyl group of oxidized cellulose obtained was measured by the method described in the specification. As a result, the content of oxidized cellulose was 1.8 mmol/g.

(Dispersion Treatment of Oxidized Cellulose)

The obtained oxidized cellulose was adjusted by deionized water so that the solid concentration thereof was set to 1.5%, and then adjusted to pH 8 using 0.5N sodium hydroxide. Subsequently, stirring was performed for 60 minutes with a high-speed rotary mixer to obtain a dispersion of transparent cellulose 1.

(Measurement of Crystallinity and Number Average Fiber Width)

Crystallinity and number average fiber width of oxidized cellulose obtained were measured by the methods described in the specification. As a result, number average fiber width of the obtained oxidized cellulose was 3.3 nm and crystallinity thereof was 73%.

Manufacturing Example 2

(Materials)

10 g of bleached kraft pulp (converted dried weight) was left to stand in 500 ml of water for one night to swell the pulp. It was controlled to a temperature of each condition shown in Table 1, and 0.1 g of TEMPO and 1 g of sodium bromide were added thereto to form a pulp suspension. Furthermore, 10 mmol/g of sodium hypochlorite per cellulose weight was added while stirring. At this time, a reaction thereof was performed at a temperature of 20° C. for 100 minutes while pH of the pulp suspension was maintained at about 10.5 by adding an about 1N aqueous solution of sodium hydroxide. Subsequently, neutralization was performed with 2N hydrochloric acid, and furthermore washing was performed with water to obtain oxidized cellulose (oxidization type).

(Measurement of the Carboxyl Group Content)

The content of a carboxyl group of oxidized cellulose obtained was measured by the method described in the specification. As a result, the content of oxidized cellulose was 1.6 mmol/g.

(Dispersion Treatment of Oxidized Cellulose)

The obtained oxidized cellulose was adjusted by deionized water so that the solid concentration was set to 1.5%, and then it was adjusted to pH 8 using 0.5N sodium hydroxide. Subsequently, stirring was performed for 60 minutes with a high-speed rotary mixer to obtain a dispersion of transparent cellulose 2.

(Measurement of Crystallinity and Number Average Fiber Width)

Crystallinity and number average fiber width of oxidized cellulose obtained were measured by the methods described in the specification. As a result, a number average fiber width of the oxidized cellulose obtained was 3.1 nm and crystallinity thereof was 75%.

Here, with respect to the obtained cellulose fiber, the content of a carboxyl group included was calculated concretely according to the method described below. 0.2 g of a chemically-treated fiber as a converted dry weight was provided in a beaker, and 80 ml of deionized water was added thereto. To the beaker, 5 ml of an aqueous solution of 0.01 M sodium chloride was added, and total pH was adjusted to pH 2.8 by adding 0.1 M hydrochloric acid while stirring. An aqueous solution of 0.1 M sodium hydroxide was provided thereto at a rate of 0.05 ml/30 seconds by an automatic titrator (AUT-701, manufactured by DKK-TOA Corporation), and electric conductivity and pH value were measured every 30 seconds until it was arrived at pH 11. A titrated amount of sodium hydroxide was determined from an electric conductivity curve obtained, and the content of a carboxyl group was calculated. As a result, the content of a carboxyl group of the cellulose fiber 1 was 1.8 mmol/g, and the content of a carboxyl group of the cellulose fiber 2 was 1.6 mmol/g.

Example 1

The cellulose fiber 1 was prepared on a base material sheet which was a 25 μm polyethylene terephthalate film so that the solid concentration thereof was set to 1.5% by weight with deionized water. Next, pH of the mixture solution was set to pH 10 using a 1N aqueous solution of sodium hydroxide, and fiberization treatment was performed with a high-speed rotary mixer to generate a coating liquid. Then, the coating liquid was coated by a bar coater (#20), and dried at a temperature of 120° C. for 5 minutes to generate an antistatic layer having a thickness of about 250 nm. Each of surface resistance and half-life of the obtained antistatic film is shown in Tables 1 and 2 provided below.

Comparative Example 1

Chitosan (Kytamer L, manufactured by Union Carbide Corporation) was prepared on a base material sheet which was a 25 μm polyethylene terephthalate film so that the solid concentration thereof was set to 1.5% by weight with a 0.1 N aqueous solution of acetic acid. Next, the coating liquid was coated by a bar coater (#20), and dried at a temperature of 120° C. for 5 minutes to generate an antistatic layer having a thickness of about 250 nm. Each of surface resistance and half-period of the obtained antistatic film was shown in Tables 1 and 2 provided below.

Comparative Example 2

Carboxymethyl cellulose (substitution degree: 1.2) was prepared on a base material sheet which was a 25 μm polyethylene terephthalate film so that the solid concentration thereof was set to 1.5% by weight with deionized water to generate a coating liquid. Next, the coating liquid was coated by a bar coater (#20), and dried at a temperature of 120° C. for 5 minutes to generate an antistatic layer having a thickness of about 250 nm. Each of surface resistance and half-period of the obtained antistatic film is shown in Tables 1 and 2 provided below.

TABLE 1

| | Surface resistance ($\Omega/\square$) | |
|---|---|---|
| | 25° C. - 20% RH | 25° C. - 50% RH |
| Example 1 | 5.46E+10 | 1.70E+08 |
| Comparative Example 1 | 8.80E+13 | 6.51E+12 |
| Comparative Example 2 | 2.88E+13 | 4.31E+12 |

TABLE 2

| | Half-period (seconds) | |
|---|---|---|
| | 25° C. - 20% RH | 25° C. - 50% RH |
| Example 1 | 3.03 | 0.12 |
| Comparative Example 1 | 23 | 10.8 |
| Comparative Example 2 | 13.1 | 5.6 |

As indicated by the results shown in Tables 1 and 2, the antistatic film (antistatic laminate) of Example 1 according to the present invention, wherein a cellulose fiber was used, had high antistatic properties, as compared with the films of Comparative Example, wherein chitosan was used, and Comparative Example 2, wherein carboxymethyl cellulose was used. Furthermore, even at 25% RH, which was low humidity, surface resistance which is required for preventing adhesion of dust and waste was maintained.

Example 2

A mixture liquid of the following mixing ratio, comprising the cellulose fiber 2, an inorganic lamellar compound and deionized water was prepared and fiberization treatment was performed for 60 minutes with a high-speed rotary mixer to generate a coating liquid wherein the cellulose fiber 2 and the inorganic lamellar compound were uniformly dispersed.

Cellulose fiber 2: 0.5 parts by weight

Inorganic lamellar compound (Na-tetrasilicic mica DMA-350, manufactured by Topy Industries Ltd.): 0.5 parts by weight Deionized water: 99 parts by weight The coating liquid was coated on a base material which was a 25 μm polyethylene terephthalate film by a bar coater (#50), and dried at a temperature of 120° C. for 15 minutes to generate an antistatic layer having a thickness of about 500 nm. Thus, an antistatic film of Example 2 was obtained.

Example 3

A mixture liquid of the following mixing ratio, comprising the cellulose fiber 2, an inorganic lamellar compound and deionized water was prepared and fiberization treatment was performed for 60 minutes with a high-speed rotary mixer to generate a coating liquid wherein the cellulose fiber 2 and the inorganic lamellar compound were uniformly dispersed.

Cellulose fiber 2: 0.35 parts by weight

Inorganic lamellar compound (Na-tetrasilicic mica DMA-350, manufactured by Topy Industries Ltd.): 0.65 parts by weight Deionized water: 99 parts by weight The coating liquid was coated on a base material which was a 25 μm polyethylene terephthalate film by a bar coater (#50), and dried at a temperature of 120° C. for 15 minutes to generate an antistatic layer having a thickness of about 500 nm. Thus, an antistatic film of Example 3 was obtained.

Example 4

A mixture liquid of the following mixing ratio, comprising the cellulose fiber 2, zeolite and deionized water was prepared and fiberization treatment was performed for 60 minutes with a high-speed rotary mixer to generate a coating liquid wherein the cellulose fiber 2 and the zeolite were uniformly dispersed.

Cellulose fiber 2: 0.35 parts by weight

Zeolite (Zeofil, manufactured by Shin Tohoku Chemical Industry Co., Ltd.): 0.65 parts by weight Deionized water: 99 parts by weight The coating liquid was coated on a base material which was a 25 μm polyethylene terephthalate film by a bar coater (#50), and dried at a temperature of 120° C. for 15 minutes to generate an antistatic layer having a thickness of about 500 nm. Thus, an antistatic film of Example 4 was obtained.

Example 5

A mixture liquid of the following mixing ratio, comprising the cellulose fiber 2 and deionized water was prepared and fiberization treatment was performed for 60 minutes with a high-speed rotary mixer to generate a coating liquid wherein the cellulose fiber 2 was uniformly dispersed.

Cellulose fiber 2: 1.0 part by weight

Deionized water: 99 parts by weight

The coating liquid was coated on a base material which was a 25 μm polyethylene terephthalate film by a bar coater (#50), and dried at a temperature of 120° C. for 15 minutes to generate an antistatic layer having a thickness of about 500 nm. Thus, an antistatic film of Example 5 was obtained.

Comparative Example 3

A mixture liquid of the following mixing ratio, comprising polyvinyl alcohol and deionized water was prepared and stirred for 10 minutes at a temperature of 100° C. to completely dissolve polyvinyl alcohol in the water.

Polyvinyl alcohol (PVA 124, manufactured by Kurary Co., Ltd.): 0.35 parts by weight Deionized water: 99 parts by weight Next, 0.65 g of an inorganic lamellar compound (Na-tetrasilicic mica DMA-350, manufactured by Topy Industries Ltd.) was added, and stirred until the polyvinyl alcohol and the inorganic lamellar compound were uniformly dispersed to obtain a coating liquid.

The coating liquid was coated on a base material which was a 25 μm polyethylene terephthalate film by a bar coater (#50), and dried at a temperature of 120° C. for 15 minutes to generate an antistatic layer having a thickness of about 500 nm. Thus, an antistatic film of Comparative Example 3 was obtained.

Comparative Example 4

A mixture liquid of the following mixing ratio, comprising polyvinyl alcohol and deionized water was prepared and stirred for 10 minutes at a temperature of 100° C. to completely dissolve polyvinyl alcohol in the water.

Polyvinyl alcohol (PVA 124, manufactured by Kurary Co., Ltd.): 0.8 parts by weight Deionized water: 99 parts by weight Next, 0.2 g of quaternary ammonium salt (Quartamin 24P, manufactured by Kao Corporation) was added, and stirred until the polyvinyl alcohol and the quaternary ammonium salt were uniformly dispersed to obtain a coating liquid.

The coating liquid was coated on a base material which was a 25 μm polyethylene terephthalate film by a bar coater (#50), and dried at a temperature of 120° C. for 15 minutes to generate an antistatic layer having a thickness of about 500 nm. Thus, an antistatic film of Comparative Example 4 was obtained.

The results of the measured surface resistivity of the antistatic films obtained by Examples 2 to 5 and Comparative Examples 3 and 4 are described in Table 3 shown below.

TABLE 3

| | Surface resistance (Ω/□) | | |
| --- | --- | --- | --- |
| | 25° C. × 20% RH | 25° C. × 50% RH | 25° C. × 70% RH |
| Example 2 | $8.07 \times 10^{10}$ | $1.03 \times 10^{9}$ | $1.19 \times 10^{8}$ |
| Example 3 | $9.48 \times 10^{9}$ | $4.06 \times 10^{8}$ | $1.00 \times 10^{8}$ or less |
| Example 4 | $7.89 \times 10^{10}$ | $1.01 \times 10^{9}$ | $1.08 \times 10^{8}$ |
| Example 5 | $7.11 \times 10^{11}$ | $9.09 \times 10^{9}$ | $1.83 \times 10^{8}$ |
| Comparative Example 3 | $7.47 \times 10^{13}$ | $1.09 \times 10^{13}$ | $2.46 \times 10^{10}$ |
| Comparative Example 4 | $4.85 \times 10^{13}$ | $5.18 \times 10^{11}$ | $4.91 \times 10^{8}$ |

As indicated by the results shown in Table 3, the antistatic films (antistatic laminate) of Examples 2 to 4 according to the present invention, wherein a cellulose fiber and a moisture absorbent were used, had high antistatic properties particularly in an environment of low humidity (20% RH), as compared with the film of Example 5 wherein the cellulose fiber was merely used, and humidity dependencies of antistatic properties, which is the object of the present invention, were remarkably improved.

Furthermore, as shown in Comparative Example 3, when a moisture absorbent and polyvinyl alcohol were used in combination, antistatic properties were not shown. A moisture absorbent itself has low antistatic properties, and it was confirmed that a moisture absorbent showed sufficient effects, when a moisture absorbent is used in combination with a cellulose fiber. Furthermore, high antistatic properties were shown as compared with a quaternary ammonium salt type antistatic agent as used in Comparative Example 4.

BRIEF DESCRIPTION OF THE REFERENCE SIGNS

1: Base material
2: Antistatic layer
3: Anchor coat layer
4: Deposition layer
5: Adhesive layer for laminate
6: Heat seal layer
7: Intermediate film layer
8: Gas barrier layer
9: Low refraction index layer
10: Hard coat layer
100, 200, 300, 400, 500, 600, 700 and 800: Antistatic laminate

The invention claimed is:

1. An antistatic laminate which includes laminated plural layers and is used to prevent charging, the laminate comprising:
a base material, and
an antistatic layer which is laminated on at least one surface side of the base material, the antistatic layer including a cellulose fiber having a carboxyl group, wherein a content of the carboxyl group per 1 g of the cellulose fiber is in a range of 0.1 mmol or more and 5 mmol or less, and at least a part of the carboxyl group of the cellulose fiber is a carboxyl acid salt.

2. The antistatic laminate according to claim 1, wherein the cellulose fiber is a cellulose fiber to which a carboxyl group is introduced by an acid reaction, and the content of the carboxyl group per 1 g of the cellulose fiber is in a range of 0.1 mmol or more and 5 mmol or less.

3. The antistatic laminate according to claim 2, wherein at least a part of the carboxyl group is a carboxyl acid salt.

4. The antistatic laminate according to claim 3, wherein a fiber width of the cellulose fiber is 2 nm or more and 50 nm or less, and a length of the cellulose fiber is 1 μm or more.

5. The antistatic laminate according to claim 4, wherein the cellulose fiber is a crystalline cellulose, and has a crystalline structure of cellulose type-I.

6. The antistatic laminate according to claim 5, wherein the antistatic layer further includes a water absorbent.

7. The antistatic laminate according to claim 6, wherein a weight ratio of the cellulose fiber and the water absorbent (cellulose fiber/water absorbent) is in a range of (5/95) or more and (95/5) or less.

8. The antistatic laminate according to claim 7, wherein the water absorbent is an inorganic lamellar compound.

9. The antistatic laminate according to claim 8, wherein a weight ratio of the cellulose fiber and the inorganic lamellar compound (cellulose fiber/inorganic lamellar compound) which are included in the antistatic layer is in a range of (20/80) or more and (70/30) or less.

10. The antistatic laminate according to claim 9, wherein the thickness of the antistatic layer is 100 nm or more.

11. The antistatic laminate according to claim 9, wherein electrical resistance at the surface of the antistatic laminate is $1.0 \times 10^{12} \Omega/\square$ or less under an environment of 25° C. and 20% RH.

12. The antistatic laminate according to claim 9, wherein a half-life of surface charge at the surface of the antistatic laminate is 10 seconds or less under an environment of 25° C. and 20% RH.

13. The antistatic laminate according to claim 9, wherein the base material is made from plastic, and haze of the antistatic laminate is in a range of 0.1% or more and 10% or less.

14. The antistatic laminate according to claim 9, wherein the base material is made from paper.

15. A laminate material which includes the antistatic laminate according to claim 9.

16. The antistatic laminate according to claim 1, wherein the antistatic layer further includes a water absorbent which is at least one selected from the group consisting of: synthetic zeolite, an inorganic laminar compound, activated carbon, polyacrylate, magnesium sulfate, calcium oxide and aluminium oxide.

17. The antistatic laminate according to claim 1, wherein the antistatic layer further includes an inorganic laminar compound which is at least one selected from the group consisting of: a kaolinite group, an antigorite group, a smectite group, a vermiculite group and a mica group.

18. The antistatic laminate according to claim 1, wherein the antistatic layer further includes an inorganic laminar compound which is at least one selected from the group consisting of: kaolinite, dickite, nacrite, halloysite, antigorite, chrysotile, pyrophyllite, montmorillonite, hectorite, tetrasilicic mica, sodium teniolite, white mica, margarite, talc, vermiculite, brown mica, xanthophyllite and chlorite.

19. The antistatic laminate according to claim 1, wherein the antistatic laminate includes, between the base material and the antistatic layer, at least one selected from the group consisting of an anchor coat layer, a deposition layer, an intermediate film layer, a gas barrier layer, a hard coat layer, a printing layer, an undercoat layer, a filling layer and an optical adjustment layer.

20. The antistatic laminate according to claim 1, wherein the carboxyl acid salt includes a cation which is used as a counter ion of the carboxyl group, and the cation is at least one selected from the group consisting of: an alkali metal ion, an alkaline earth metal ion, an ammonium ion and an alkyl ammonium ion.

21. The antistatic laminate according to claim 1, wherein the base material and the antistatic layer directly contact with each other.

22. The antistatic laminate according to claim 1, wherein the content of the carboxyl group per 1 g of the cellulose fiber is in a range of 0.5 mmol or more and 3 mmol or less.

* * * * *